(12) United States Patent
Zhong et al.

(10) Patent No.: US 10,499,518 B2
(45) Date of Patent: Dec. 3, 2019

(54) FIXATION BRACKET AND CONTROL DEVICE

(71) Applicant: Tyco Electronics (Shanghai) Co. Ltd., Shanghai (CN)

(72) Inventors: Yuan Zhong, Shanghai (CN); Ting Tao, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 14/848,607

(22) Filed: Sep. 9, 2015

(65) Prior Publication Data

US 2016/0073523 A1    Mar. 10, 2016

(30) Foreign Application Priority Data

Sep. 9, 2014    (CN) .................... 2014 2 0515268 U

(51) Int. Cl.
*H05K 5/02* (2006.01)
*H02B 1/052* (2006.01)
*F16B 2/22* (2006.01)
*F16M 13/02* (2006.01)

(52) U.S. Cl.
CPC ............ *H05K 5/0204* (2013.01); *F16B 2/22* (2013.01); *F16M 13/022* (2013.01); *H02B 1/0526* (2013.01)

(58) Field of Classification Search
CPC . H05K 5/0204; F16B 2/22; F16B 2/24; F16B 2/241; F16B 2/243; F16B 2/245; F16B 2/246; F16M 13/022; H02B 1/0526; H02B 1/052; H02B 1/0523
See application file for complete search history.

(56) References Cited

U.S. PATENT DOCUMENTS

| | | | | |
|---|---|---|---|---|
| 3,992,074 A * | 11/1976 | Rymer | ..................... | H01R 9/26 439/716 |
| 5,090,922 A * | 2/1992 | Rymer | ................. | H01R 9/2608 439/716 |
| 5,192,227 A * | 3/1993 | Bales | ................... | H01R 9/2608 439/532 |
| 6,839,239 B1 * | 1/2005 | Lee | ...................... | H05K 5/0286 206/308 |
| 2010/0314522 A1* | 12/2010 | Molnar | ................. | H02B 1/052 248/346.06 |
| 2012/0262894 A1* | 10/2012 | Soefker | ................ | H02B 1/052 361/759 |
| 2012/0298490 A1* | 11/2012 | Buttner | ................. | H02B 1/052 200/303 |
| 2015/0016875 A1* | 1/2015 | Eminovic | .............. | H02B 1/052 403/322.4 |

* cited by examiner

*Primary Examiner* — Christopher Garft
(74) *Attorney, Agent, or Firm* — Barley Snyder

(57) ABSTRACT

A fixation bracket has: a housing; an elastic rail receiving structure disposed along a bottom of the housing; and a connection arm connected to the elastic rail receiving structure and having one end extending above the housing.

21 Claims, 8 Drawing Sheets

FIXATION BRACKET AND CONTROL DEVICE

CROSS-REFERENCE TO RELATED APPLICATIONS

This application claims the benefit of the filing date under 35 U.S.C. § 119(a)-(d) of Chinese Patent Application No. 201420515268.4 filed on Sep. 9, 2014.

FIELD OF THE INVENTION

The invention relates to a fixation bracket and, in particular, to a fixation bracket for mounting on a circuit board.

BACKGROUND

FIGS. 1-4 show a known fixation bracket for mounting a circuit board thereon.

As shown in FIG. 1, the known fixation bracket includes a pair of longitudinal beams 110' and a pair of end plates 120'. The pair of longitudinal beams 110' extends along a length of the fixation bracket. The pair of end plates 120' is connected to ends of the pair of longitudinal beams 110', respectively. A circuit board 200' is mounted on the fixation bracket.

As shown in FIGS. 1 and 2, in the prior art, an elastic rail receiving structure 121', 122', 123' is formed on a bottom of each end plates 120'. Each elastic rail receiving structure 121', 122', 123' includes a pair of guide rail receiving slots 121', 122' and an elastic arm 123'. The pair of guide rail receiving slots 121', 122' are adapted to be snapped onto edges 321', 322' along both sides of the guide rail 300'. One guide rail receiving slot 122' of the pair of guide rail receiving slots 121', 122' is formed in the elastic arm 123'. The pair of guide rail receiving slots 121', 122' is constructed to face to each other in a width direction of the fixation bracket.

As shown in FIGS. 1 and 2, in the prior art, the known fixation bracket further includes a connection arm 124' connected to the elastic arm 123', and the connection arm 124' extends outwardly underneath the fixation bracket. The known fixation bracket further includes a protrusion 125' protruding upwardly from an end of the connection arm 124' and is positioned adjacent to an outer side of the known fixation bracket.

The known fixation bracket and the circuit board 200' are mounted in a cabinet (not shown) of a control device. In practical use, in order to satisfy maintenance requirements, it is sometimes desirable to disassemble the circuit board and the known fixation bracket from the guide rail in the cabinet.

As shown in FIGS. 3 and 4, the protrusion 125' protruding from the connection arm 124' may be pried by the screw driver 400' such that the guide rail receiving slot 122' on the bottom of the fixation bracket is detached from the edge 322' of the guide rail, thereby the known fixation bracket is disassembled from the guide rail 300'.

As shown in FIGS. 3 and 4, during disassembly, the screw driver 400' needs to be rotated at a certain angle in a direction indicated by the arrow, that is to say, a receiving space must be provided for the screw driver 400', or else the fixation bracket cannot be disassembled from the guide rail 300'. Thus, relatively large spaces for the screw driver 400' at both sides of the fixation bracket are required, that is, no other components can be placed in the relatively large spaces along both sides of the fixation bracket, which thereby causes waste of space. As a result, the number of the circuit boards placed in the cabinet is limited. In addition, since the protrusion 125' is located on the bottom of the known fixation bracket, the sight line is blocked by the known fixation bracket when an operator puts the screw driver 400' onto the protrusion 125', thus he or she must observe the protrusion 125' from sides of the fixation bracket only by a particular angle, then put the screw driver 400 onto the protrusion 125' carefully, thereby causing an inefficient and inconvenient operation.

SUMMARY

An objective of the invention is to solve at least one aspect of the above problems and defects in the prior art, among others. A fixation bracket therefore has: a housing; an elastic rail receiving structure disposed along a bottom of the housing; and a connection arm connected to the elastic rail receiving structure and having one end extending above the housing.

BRIEF DESCRIPTION OF THE DRAWINGS

The above and other features of the invention will become more apparent by describing in detail exemplary embodiments thereof with reference to the accompanying drawings, in which.

DETAILED DESCRIPTION OF THE EMBODIMENT(S)

Figure 1:
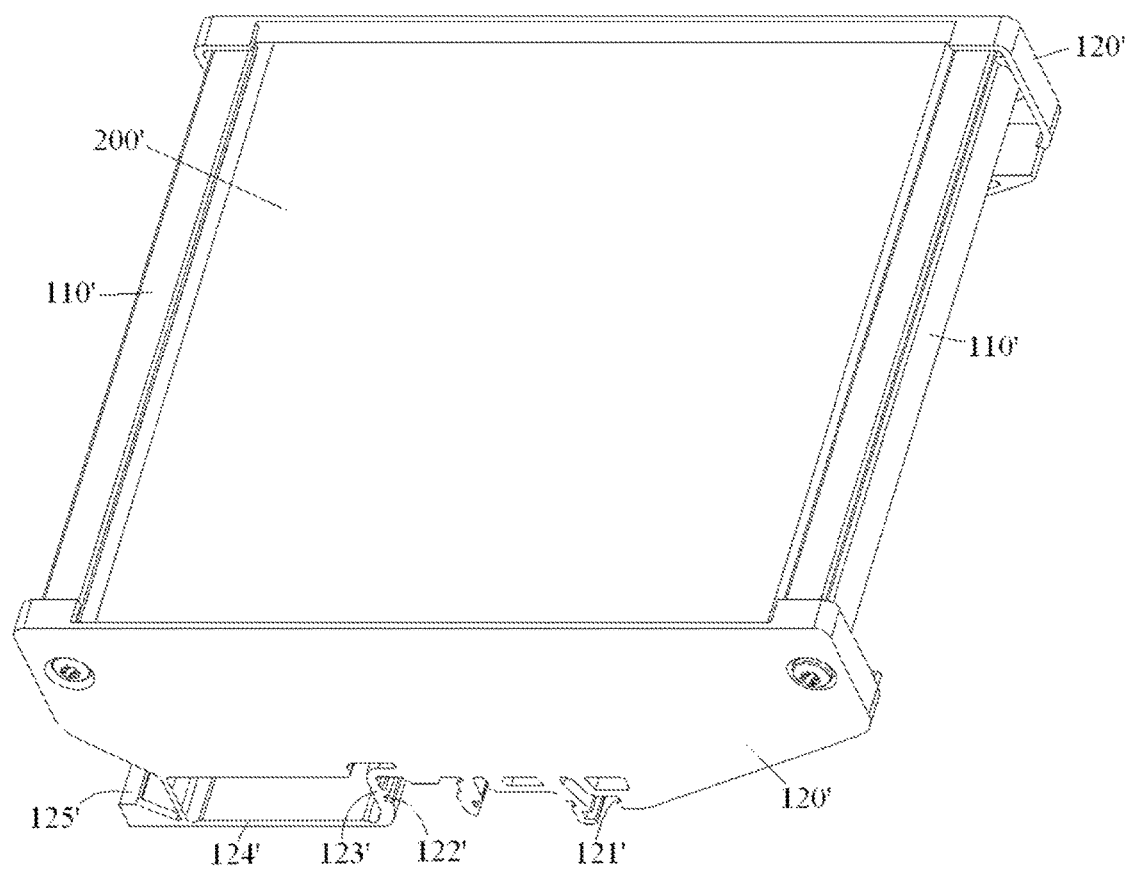
FIG. 1 shows a perspective view of a known fixation bracket for mounting a circuit board.
Figure 2:
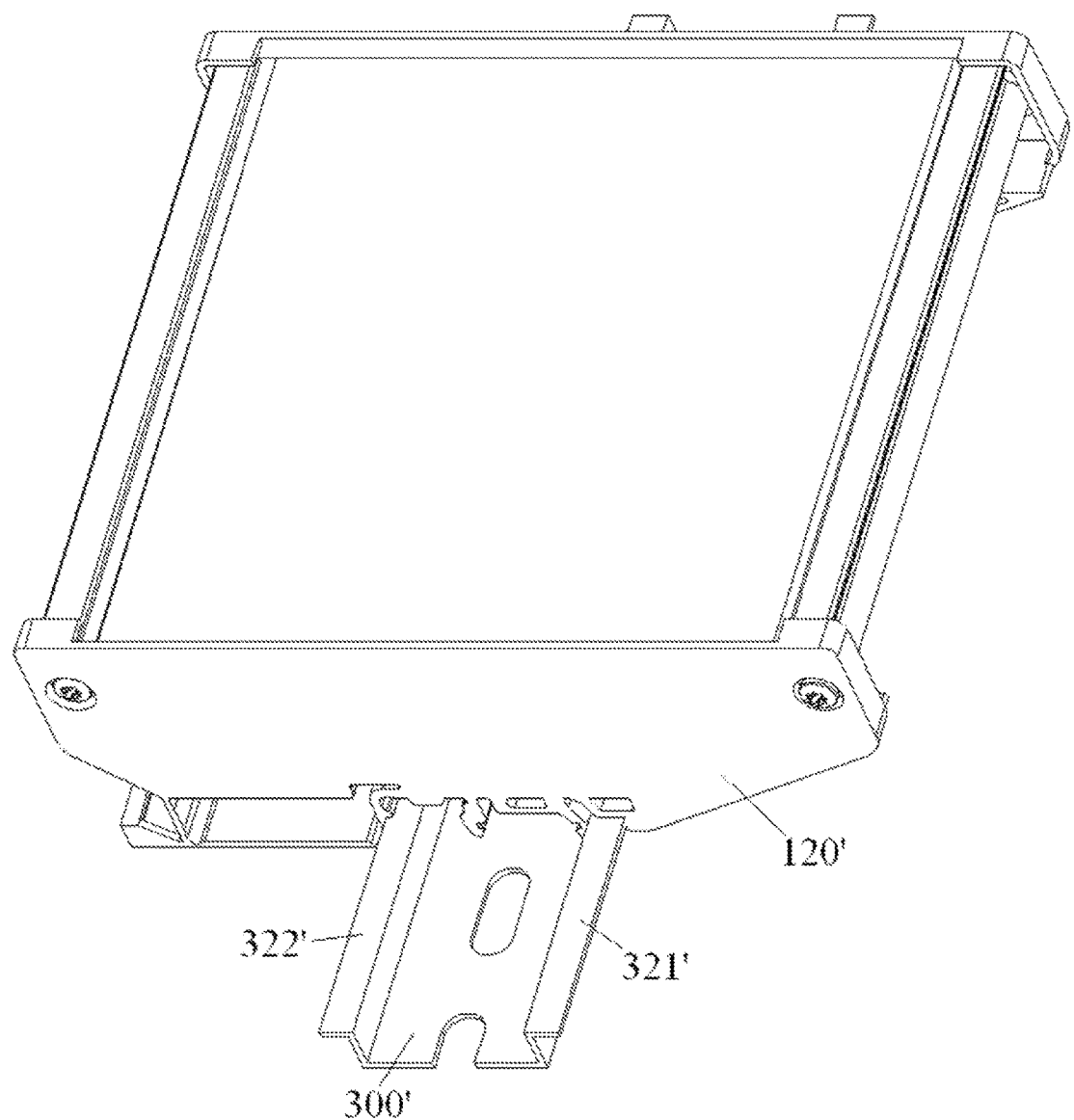
FIG. 2 shows a perspective view of the known fixation bracket of FIG. 1 that snap-fitted on a known guide rail.
Figure 3:
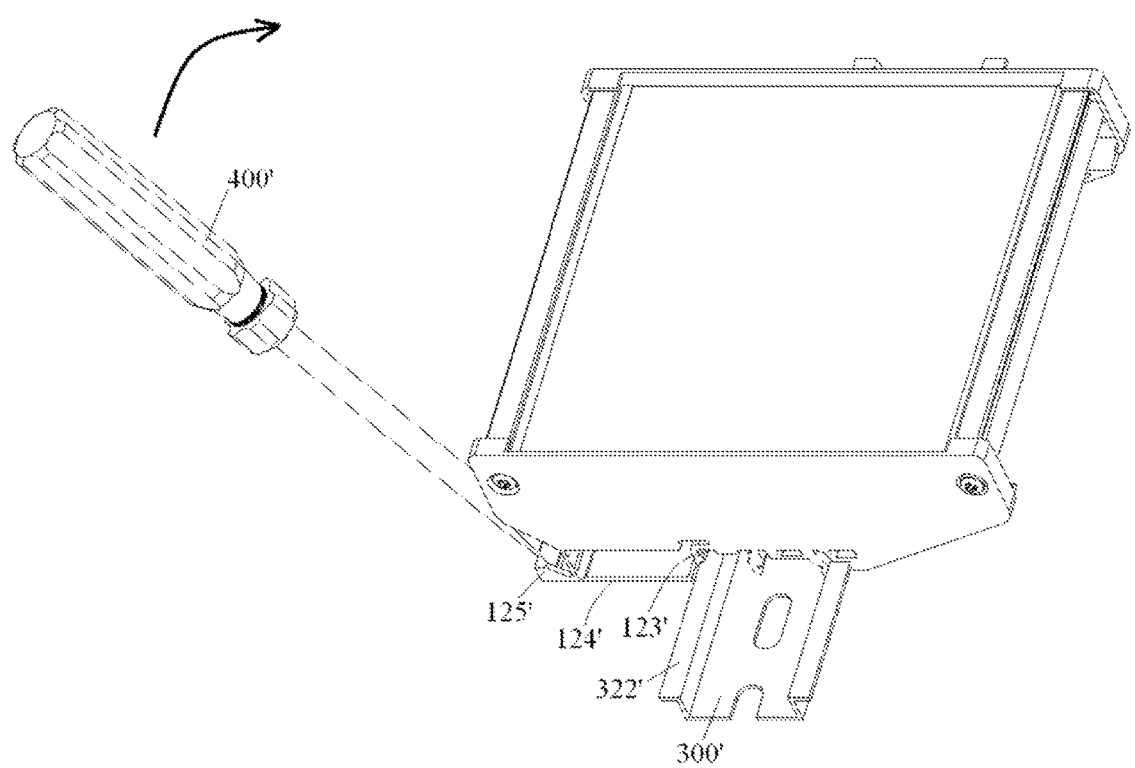
FIG. 3 shows a perspective view of a known fixation bracket mounted on a guide rail and a screw driver for disassembly the same.
Figure 4:
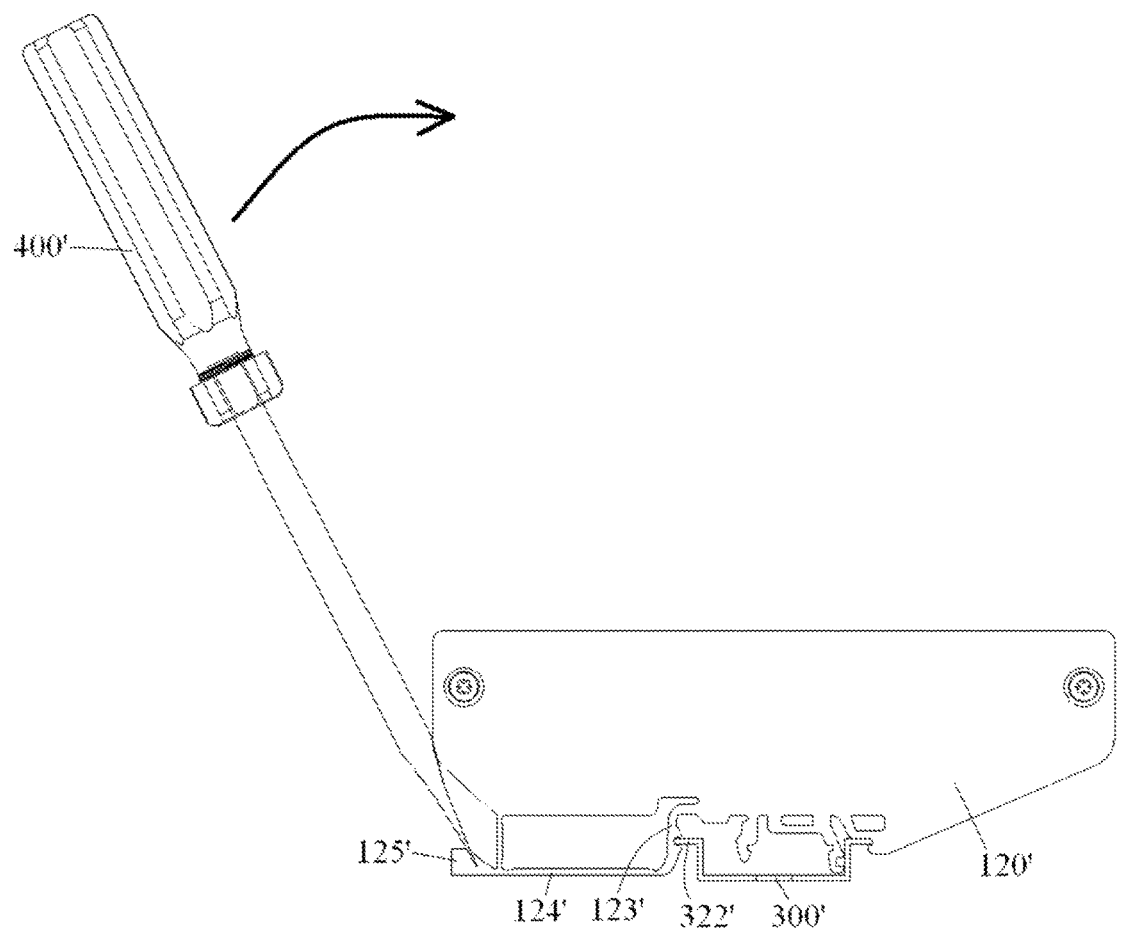
FIG. 4 shows a side view of the fixation bracket and the guide rail of FIG. 3.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the invention, a fixation bracket according to the invention is provided and adapted to mount a circuit board thereon. The fixation bracket generally includes an elastic rail receiving structure formed on a bottom of the fixation bracket and engaged with a guide rail; and a connection arm connected to the elastic rail receiving structure, a part of the connection arm being located above the fixation bracket. The elastic rail receiving structure is constructed to move away from the guide rail such that the elastic rail receiving structure is detached from the guide rail when the connection arm is pulled by the part of the connection arm located above the fixation bracket.

Figure 5:
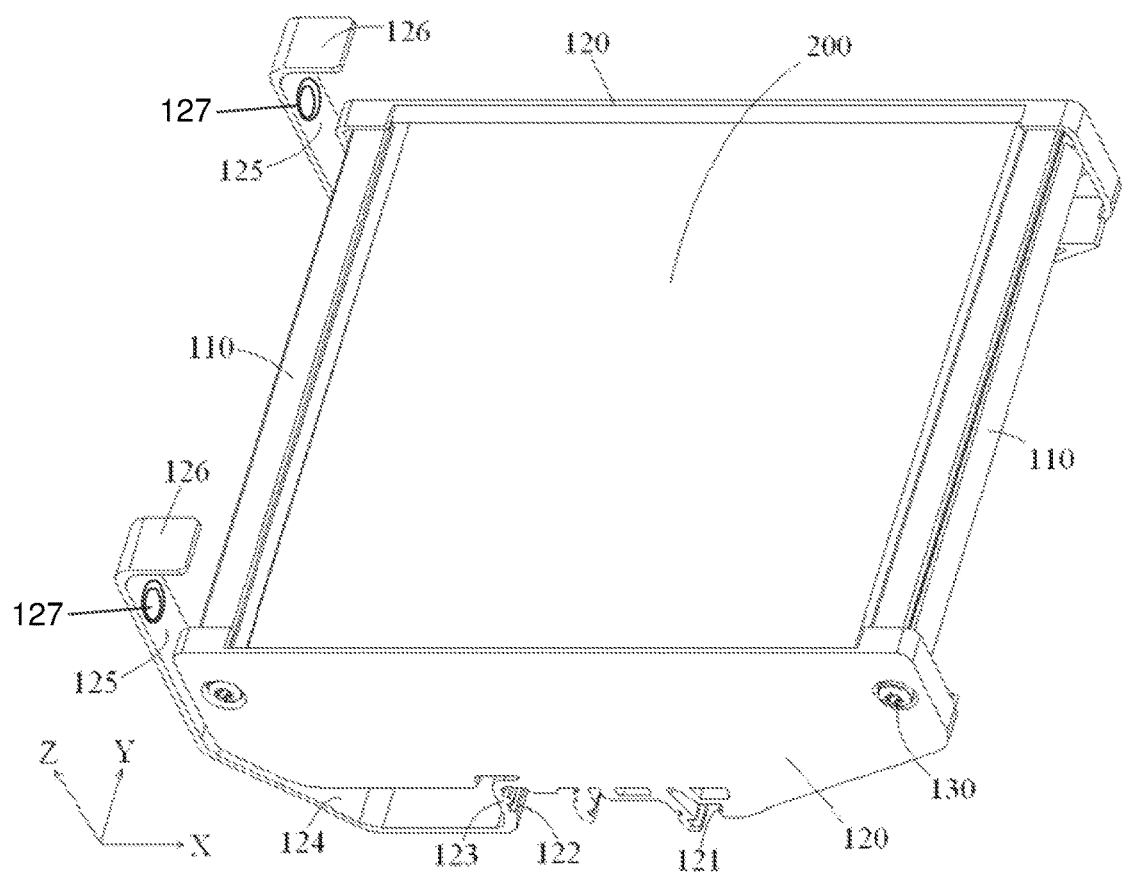
FIG. 5 shows a perspective view of a fixation bracket according to the invention.
Figure 6:
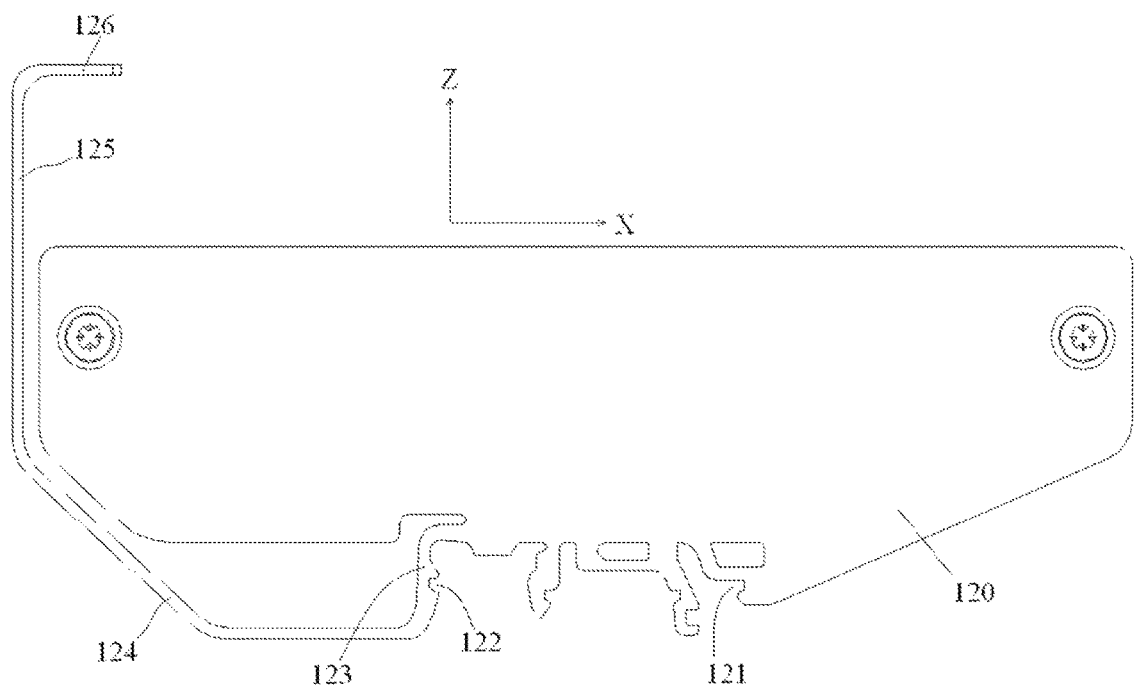
FIG. 6 shows a side view of the fixation bracket of FIG. 5.

As shown in FIG. 5, in an exemplary embodiment of the invention, the fixation bracket includes a pair of longitudinal beams 110 extending along a length direction Y of the fixation bracket, and a pair of end plates 120 connected to opposite ends of the pair of longitudinal beams 110, respectively. In the shown embodiment, the end plates 120 are connected detachably to the ends of longitudinal beams 110, for example, by a threaded connection 130.

Further referring to FIG. 5, in the shown embodiment, a circuit board 200 is held and supported on the pair of longitudinal beams 110 and the pair of end plates 120 such that the circuit board 200 is mounted on the fixation bracket. The circuit board 200 may be removed when the end plates 120 are disassembled from the longitudinal beams 110.

Figure 7:
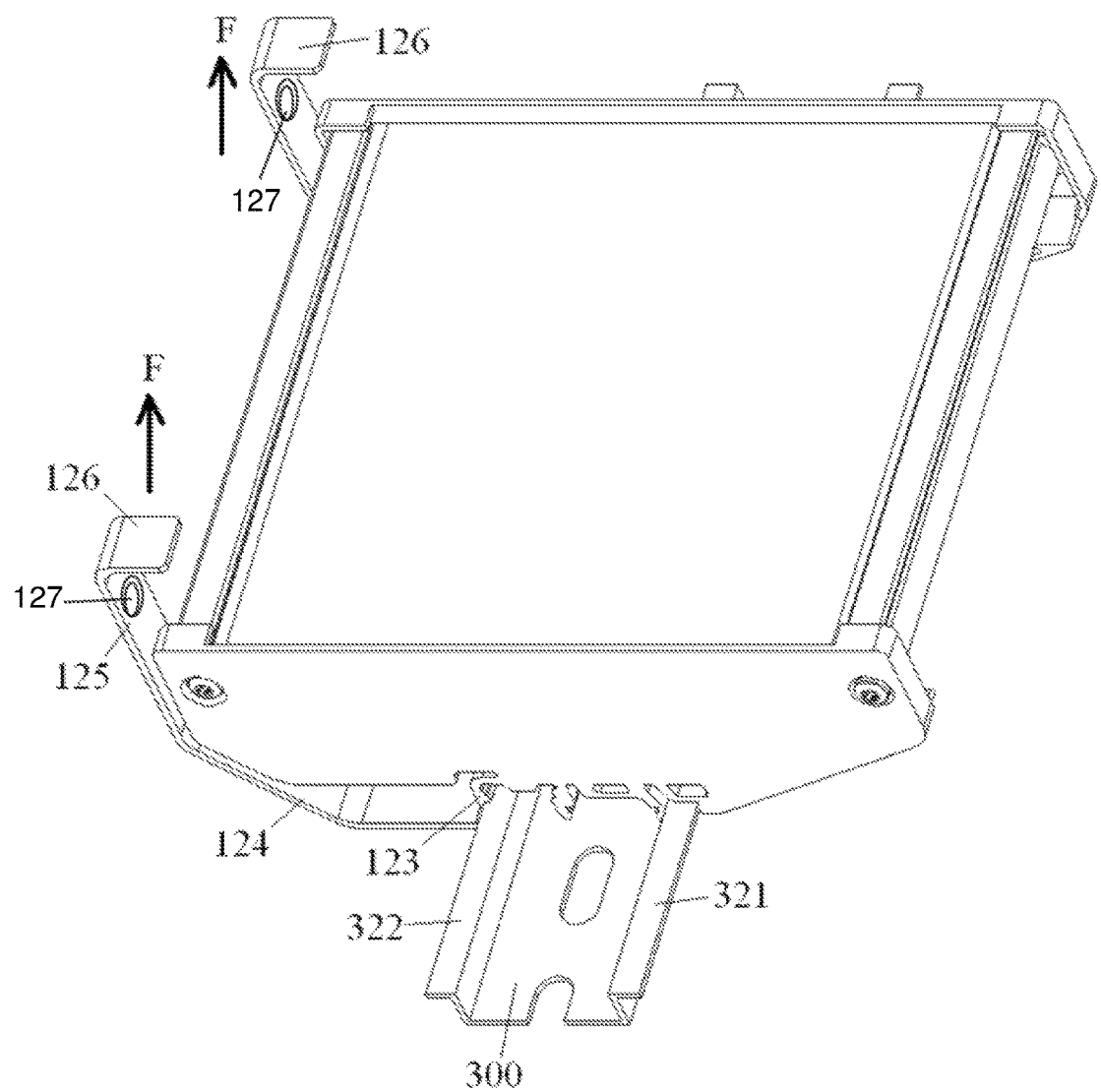
FIG. 7 shows a perspective view of the fixation bracket of FIG. 5 that is assembled on a guide rail.

As shown in FIGS. 5 and 7, in an exemplary embodiment of the invention, the fixation bracket includes an elastic rail receiving structure (further described in detail below) provided on a bottom of the fixation bracket and configured to be snapped on a guide rail 300 for supporting the fixation bracket.

As shown in FIGS. 5-8, in an exemplary embodiment of the invention, an elastic rail receiving structure is formed on a bottom of each of the end plates 120. In the shown embodiment, each elastic rail receiving structure generally includes a pair of guide rail receiving slots 121, 122 for receiving edges 321, 322 of the guide rail 300 and an elastic arm 123. As shown in FIGS. 5-8, the pair of guide rail receiving slots 121, 122 is configured to be snapped on the edges 321, 322 in both sides of the guide rail 300. One guide rail receiving slot 122 of the pair of guide rail receiving slots 121, 122 is formed in the elastic arm 123, which is configured to apply a resilient retention force to the guide rail 300, so as to the pair of guide rail receiving slots 121, 122 may be snapped firmly on the edges 321, 322 in both sides of the guide rail 300.

As shown in FIGS. 5-8, in an exemplary embodiment of the invention, the fixation bracket further includes a connection arm (further described in detail below) connected to the elastic arm 123 of the elastic rail receiving structure, and the connection arm has a handle portion 126 positioned above the fixation bracket. When an operator grasps the handle portion 126 and pulls the connection arm upwardly in a direction indicated by the arrow F shown in FIGS. 7 and 8, the elastic arm 123 of the elastic rail receiving structure moves away from the guide rail 300, and then the pair of guide rail receiving slots 121, 122 of the elastic rail receiving structure is detached from the edges 321, 322 of the guide rail 300, thus the fixation bracket may be disassembled from the guide rail 300.

As shown in FIGS. 5-8, in an exemplary embodiment of the invention, the connection arm generally includes a first arm 124, a second arm 125 and a third arm (handle portion) 126. In the shown embodiment, the first arm 124 is connected to the elastic arm 123 and extends, in a direction substantially parallel to the bottom of the fixation bracket, away from the pair of guide rail receiving slots 121, 122 to one side of the fixation bracket underneath the bottom of the fixation bracket. The second arm 125 is connected to the first arm 124 and extends upwardly above a top surface of the fixation bracket, in a direction substantially perpendicular to the first arm 124, from the first arm 124 beside the side of the fixation bracket. The third arm 126 is connected to the second arm 125 and extends towards an inner side of the fixation bracket from the second arm 125 above the top surface of the fixation bracket. In the shown embodiment, the third arm 126 forms a handle portion 126 for facilitating an operator to grasp. However, it should be noted that the handle portion 126 is not essential, and may be omitted in the invention.

In another embodiment of the invention, as shown in FIGS. 5 and 7, member receiving space 127 may be formed as a hole in the part of the second arm 125 extending above the top surface of the fixation bracket. Accordingly, the operators fingers may be inserted into the member receiving space 127 to pull the connection arm upwardly.

Figure 8:
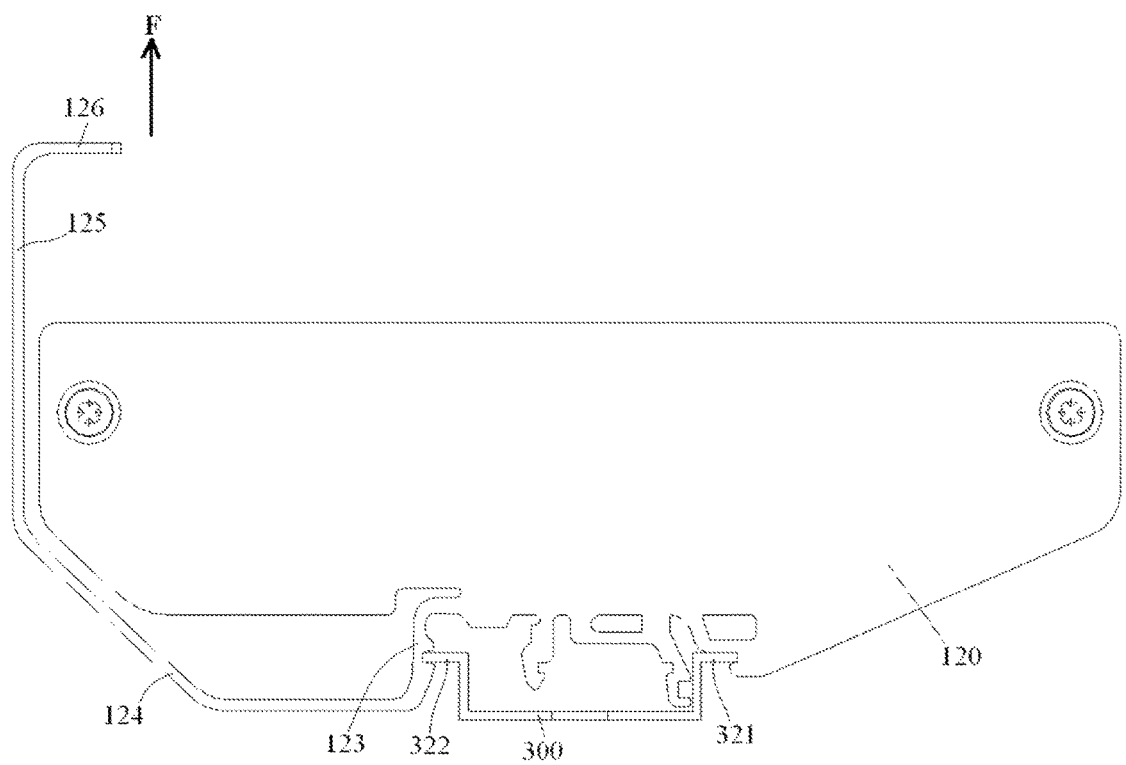
FIG. 8 shows a side view of the fixation bracket shown in FIG. 7.

In the embodiment shown in FIGS. 5-8, when the operator grasps the handle portion 126 and pulls the connection arm upwardly in a direction indicated by the arrow F shown in FIGS. 7 and 8, the elastic arm 123 and the guide rail receiving slot 122 formed in the elastic arm 123 moves away from the edge 322 of the guide rail 300 such that the guide rail receiving slots 121, 122 formed in the elastic arm 123 is separated from the edges 321, 322 of the guide rail 300.

Therefore, in the shown embodiment, the connection arm may be pulled by means of the handle portion 126 such that the elastic rail receiving structure is detached from the guide rail 300, thus the fixation bracket may be disassembled manually and simply from the guide rail 300, without requiring for any special disassembling tools, and it does not need to leave a large operation space at both sides of the fixation bracket, thereby saving the space and reducing the volume of a cabinet of a control device for mounting the fixation bracket and the guide rail 300.

As shown in FIGS. 5-8, in an exemplary embodiment of the invention, the connection arm is spaced from the end plates 120 and extends substantially along an outer contour defined by the end plates 120.

As shown in FIGS. 5-8, in the shown embodiment, the first arm 124 of the connection arm extends substantially along a bottom contour of the fixation bracket. The second arm 125 of the connection arm extends substantially in a height direction Z of the fixation bracket. The handle portion 126 of the connection arm extends substantially in a width direction X of the fixation bracket.

In an exemplary embodiment of the invention, as shown in FIGS. 5-8, the elastic rail receiving structure, the connection arm and the end plates 120 are formed integrally.

According to another aspect of the invention, there is further disclosed a control device. The control device generally includes a housing (not shown) mounted in the cabinet, a guide rail 300 mounted in the cabinet, a fixation bracket, according to any one of the above described embodiments, received in the cabinet and mounted on the guide rail 300, and a circuit board 200 received in the cabinet and mounted onto the fixation bracket.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A fixation bracket, comprising:
   a housing having a bottom and an opposite uppermost top surface;
   an elastic rail receiving structure disposed along the bottom of the housing; and
   connection arms only located on one side of the housing and integrally formed with the elastic rail receiving structure, the connection arms having one end disposed entirely above the uppermost top surface of the housing and extending parallel to the uppermost top surface, an upwardly detaching direction of the connection arms extend orthogonal to a guide rail, the guide rail being parallel to the uppermost top surface.

2. The fixation bracket according to claim 1, wherein the housing includes a pair of longitudinal beams extending along a length thereof and a pair of end plates connecting to ends of the pair of longitudinal beams, respectively.

3. The fixation bracket according to claim 2, wherein the elastic rail receiving structure is positioned on a bottom of each of the pair of end plates.

4. The fixation bracket according to claim 3, wherein the elastic rail receiving structure includes a pair of guide rail receiving slots corresponding to edges of a guide rail.

5. The fixation bracket according to claim 4, wherein the elastic rail receiving structure further includes an elastic arm on which one of the pair of guide rail receiving slots is disposed.

6. The fixation bracket according to claim 5, wherein the connection arms include a first arm connected to the elastic arm and extending away from the pair of guide rail receiving slots along one side of the housing.

7. The fixation bracket according to claim 6, wherein the connection arms further include a second arm connected to the first arm and extending upwardly above the top surface of the housing.

8. The fixation bracket according to claim 7, wherein the connection arms further include a third arm connected to the second arm, the third arm extending away from the second arm above the top surface of the housing and forming the one end of the connection arms.

9. The fixation bracket according to claim 8, further comprising a member receiving space disposed along the second arm above the top surface of the housing.

10. The fixation bracket according to claim 9, wherein the connection arms are spaced from the pair of end plates and extend substantially along an outer contour defined by the pair of end plates.

11. The fixation bracket according to claim 10, wherein the second arm extends along a height of the housing extending from the bottom toward the top surface.

12. The fixation bracket according to claim 11, wherein the third arm extends along a width of the housing perpendicular to the height of the housing.

13. The fixation bracket according to claim 9, wherein the member receiving space extends through the second arm.

14. The fixation bracket according to claim 2, wherein the connection arms, the elastic rail receiving structure, and the pair of end plates are integrally formed.

15. The fixation bracket according to claim 2, wherein a circuit board is held and supported on the pair of longitudinal beams and the pair of end plates.

16. The fixation bracket according to claim 1, wherein the bottom of the housing extends parallel to the top surface of the housing.

17. The fixation bracket according to claim 16, wherein the housing has a pair of opposite sides connecting the bottom and the top surface.

18. The fixation bracket according to claim 17, wherein the connection arms include a first arm connected to an elastic arm of the elastic rail receiving structure and extending away from the elastic rail receiving structure, and a second arm connected to the first arm and extending upwardly above the top surface of the housing.

19. The fixation bracket according to claim 18, wherein the first arm and the second arm extend along one of the pair of opposite sides.

20. The fixation bracket according to claim 8, wherein the third arm is above an uppermost point in a height of the housing extending from the bottom toward the top surface.

21. The fixation bracket according to claim 5, wherein, when the connection arms are moved in the upwardly detaching direction, the pair of guide rail receiving slots are detached from the edges of the guide rail.

* * * * *